US009819478B1

(12) United States Patent
Ho et al.

(10) Patent No.: US 9,819,478 B1
(45) Date of Patent: Nov. 14, 2017

(54) MULTI-CHANNEL TRANSMITTER SYNCHRONIZATION CIRCUITRY

(71) Applicant: Lattice Semiconductor Corporation, Hillsboro, OR (US)

(72) Inventors: Vinh Ho, Milpitas, CA (US); Qin Wei, San Jose, CA (US); Magathi Jayaram, San Jose, CA (US); Hamid Ghezel, Santa Cruz, CA (US)

(73) Assignee: Lattice Semiconductor Corporation, Portland, OR (US)

( * ) Notice: Subject to any disclaimer, the term of this patent is extended or adjusted under 35 U.S.C. 154(b) by 979 days.

(21) Appl. No.: 13/681,782

(22) Filed: Nov. 20, 2012

Related U.S. Application Data

(60) Provisional application No. 61/699,002, filed on Sep. 10, 2012, provisional application No. 61/714,636, filed on Oct. 16, 2012.

(51) Int. Cl.
*H04L 5/22* (2006.01)
(52) U.S. Cl.
CPC ..................................... *H04L 5/22* (2013.01)
(58) Field of Classification Search
None
See application file for complete search history.

(56) References Cited

U.S. PATENT DOCUMENTS

| 5,537,655 | A | * | 7/1996 | Truong ........................... 714/12 |
| 7,020,002 | B2 | * | 3/2006 | Yamamoto ............. G11C 5/063 |
| | | | | 365/189.05 |
| 7,272,677 | B1 | | 9/2007 | Venkata et al. |
| 7,304,507 | B1 | * | 12/2007 | Tran et al. ...................... 326/93 |
| 7,532,646 | B2 | | 5/2009 | Leung et al. |
| 7,656,187 | B2 | | 2/2010 | Tran et al. |
| 8,238,452 | B1 | | 8/2012 | Sarmah |
| 2004/0128578 | A1 | * | 7/2004 | Jonnalagadda ............... 713/400 |

* cited by examiner

*Primary Examiner* — Huy D Vu
*Assistant Examiner* — Teisha D Hall

(57) ABSTRACT

In one embodiment, an integrated circuit has one or more multi-channel transmitters, each transmitter having synchronization circuitry that synchronizes different copies of a reset signal used to reset different sets of TX channel circuitry used to generate the multiple TX signals, to reduce the skew between the different TX signals. Each set of synchronization circuitry has (at least) two synchronization stages that re-time different copies of the reset signal to a selected clock signal. In one implementation, the integrated circuit has (at least) two quads, each of which can generate four different TX signals, where both quads can be configured to use the same clock signal to re-time different copies of the reset signal such that the eight different TX signals are all synchronized to one another.

15 Claims, 2 Drawing Sheets

200

MULTI-CHANNEL TRANSMITTER SYNCHRONIZATION CIRCUITRY

CROSS-REFERENCE TO RELATED APPLICATIONS

This application claims the benefit of the filing dates of U.S. provisional application No. 61/699,002, filed on Sep. 10, 2012, and U.S. provisional application No. 61/714,636, filed on Oct. 16, 2012, the teachings of both of which are incorporated herein by reference in their entirety.

TECHNICAL FIELD

The present invention relates to electronics, and, more specifically but not exclusively, to multi-channel transmitters.

BACKGROUND

This section introduces aspects that may help facilitate a better understanding of the invention. Accordingly, the statements of this section are to be read in this light and are not to be understood as admissions about what is prior art or what is not prior art.

Most multi-channel protocol standards have requirements to ensure that the transmitter (TX) lane-to-lane skew is within a specified level, in order to ensure that most of the receiver (RX) de-skew (e.g., multi-channel alignment) processing is for misalignment that results from transmitting the multiple signals in parallel from the transmitter to the receiver, e.g., over different traces. As data frequency rates increase, it becomes more difficult to achieve desired levels of inter-channel alignment.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 1:
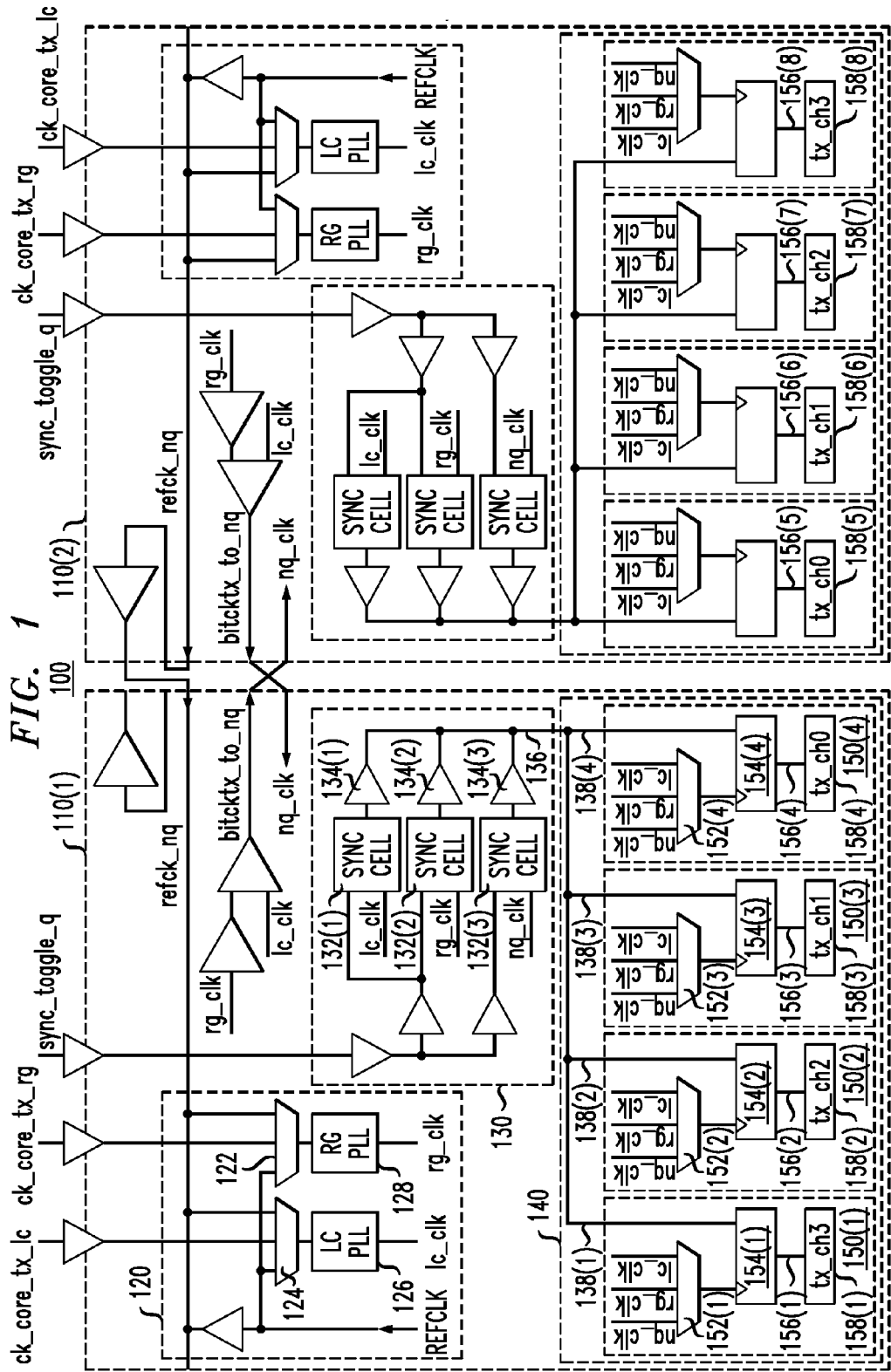
FIG. 1 shows a schematic block diagram of the synchronization (sync) circuitry for a pair of quads in an integrated circuit, according to one embodiment of the disclosure.

FIG. 1 shows a schematic block diagram of the synchronization (sync) circuitry for a pair of quads 110(1) and 110(2) in an integrated circuit 100, according to one embodiment of the disclosure. Although not necessarily depicted in FIG. 1, each quad 110 has (i) a multi-channel receiver configured to receive and process four incoming RX signals received from a remote transmitter, (ii) a multi-channel transmitter configured to generate and transmit four outgoing TX signals to a remote receiver, and (iii) an auxiliary block configured to generate the clock signals and bias currents used by the quad's receiver and transmitter.

Each quad 110 is capable of generating its four TX signals using any one of three different clock signals: a relatively low-speed clock rg_clk, a relatively high-speed clock lc_clk, and a neighboring-quad clock nq_clk, where nq_clk is the clock used by the other quad in the pair to generate its four TX signals. For example, if quad 110(1) is configured (e.g., programmed) to use the low-speed clock rg_clk to generate its four TX signals, then quad 110(2) can be configured to use any of (i) its local low-speed clock rg_clk, (ii) its local high-speed clock lc_clk, or (iii) clock nq_clk, which is the low-speed clock rg_clk used by quad 110(2). Note that all nine permutations of quad clock configurations are available except for both quads 110(1) and 110(2) configured to select nq_clk.

As indicated in FIG. 1, quad 110(1) generates a first set of four TX signals 158(1)-158(4), while quad 110(2) generates a second set of four TX signals 158(5)-158(8). As shown in FIG. 1 and as described further below, quad 110(1) has sync circuitry for generating a first set of four synchronized reset signals 156(1)-156(4), while quad 110(2) has equivalent sync circuitry for generating a second set of four synchronized reset signals 156(5)-156(8), where each different reset signal 156($i$) is applied to a different, enabled set of TX channel circuitry used to generate a different corresponding TX signal 158($i$). Each pulse in each reset signal 156($i$) resets the serializers internal to the corresponding set of TX channel circuitry. By synchronizing the different reset signals 156, the corresponding TX signals 158 generated by those different, enabled sets of TX channel circuitry will also be synchronized. Since quads 110(1) and 110(2) have equivalent structure, only the structure of quad 110(1) will be explicitly described herein.

As shown in FIG. 1, auxiliary block 120 of quad 110(1) includes circuitry for generating the low-speed clock rg_clk and the high-speed clock lc_clk, where each of these two clocks can be generated based on any one of three different reference clocks. Auxiliary block 120 includes other, unrelated circuitry not depicted in FIG. 1.

In particular, low-speed clock rg_clk can be based on any one of (i) a low-speed, core reference clock ck_core_tx_rg, which is provided from the core of integrated circuit 100, (ii) a local-quad reference clock REFCLK, which is provided from a pad (not shown), which is connected to an external reference clock source, and (iii) a neighboring-quad reference clock reclk_nq, which is the reference clock selected by neighboring quad 110(2). Auxiliary block 120 comprises a 3:1 multiplexer (mux) 122 that is configured to select one of these three clocks for use by a low-speed phase-locked loop (PLL) 128 in generating the low-speed clock rg_clk. Note that mux 122 and the equivalent mux in quad 110(2) cannot both be programmed to select the reference clock reclk_nq.

Similarly, high-speed clock lc_clk can be independently based on any one of (i) a high-speed, core reference clock ck_core_tx_lc, which is provided from the core of integrated circuit 100, (ii) the local-quad reference clock REFCLK, and (iii) the neighboring-quad reference clock reclk_nq. Auxiliary block 120 comprises a 3:1 mux 124 that is configured to select one of these three clocks for use by a high-speed PLL 126 in generating the high-speed clock lc_clk. Here, too, mux 124 and the equivalent mux in quad 110(2) cannot both be programmed to select the reference clock reclk_nq.

As suggested previously, it is desirable (and, for some applications, even required) that the four TX signals 158(1)-158(4) transmitted from quad 110(1) be synchronized with one another such that their inter-channel skews are within a specified level (e.g., less than one unit interval (UI)). For some applications, all eight TX signals 158(1)-158(8) transmitted from both quads 110(1) and 110(2) need to be synchronized to within a specified skew level. Typically, TX signals are synchronized by applying different copies of a common reset signal to the different sets of TX channel circuitry used to generate those TX signals. However, because the four different sets of TX channel circuitry within each quad are physically separated from one another and because the two quads are likewise displaced from each other, integrated circuit 100 is designed with sync circuitry to synchronize the different copies of the reset signal applied to the different sets of TX channel circuitry in order to reduce the skew between those different reset signal copies.

In particular, the sync circuitry in quad 110(1) has two stages: (1) a first sync stage 130 in which the selected clock signal is used to re-time the reset signal sync_toggle_q received from the core of integrated circuit 100 to generate a first-synchronized reset signal 136 and (2) a second sync stage 140 in which the selected clock signal is used to re-time four different copies 138(1)-138(4) of the first-synchronized reset signal 136 to generate four different reset signals 156(1)-156(4) applied to the four different sets of TX channel circuitry in quad 110(1) to generate the four TX signals 158(1)-158(4).

As shown in FIG. 1, first sync stage 130 comprises three parallel sync cells 132(1)-132(3), where:

Sync cell 132(1) re-times a first copy of reset signal sync_toggle_q based on the fast clock lc_clk;

Sync cell 132(2) re-times a second copy of reset signal sync_toggle_q based on the slow clock rg_clk; and Sync cell 132(3) re-times a third copy of reset signal sync_toggle_q based on the neighboring-quad clock nq_clk.

At the output of each sync cell **132(*i*) is a driver 134(*i*) that can be programmably powered on or off to selectively provide the output of that sync cell as the first-synchronized reset signal 136 generated by first sync stage 130. At most, only one of drivers 134(1)-134(3)** is powered on at a time.

Second sync stage 140 has four identical, parallel sync sub-stages 150(1)-150(4), each of which receives an identical copy **138(*i*) of the first-synchronized reset signal 136 and generates a corresponding reset signal 156(*i*). For example, sync sub-stage 150(1) comprises a 3:1 mux 152(1) which selects one of the three clock signals rg_clk, lc_clk, and nq_clk (i.e., the same clock signal used in the first sync stage 130) to apply to sync cell 154(1) for use in re-timing the first copy 138(1) of the first-synchronized reset signal 136 to generate reset signal 156(1)**.

In this way, quad 110(1) generates the four reset signals 156(1)-156(4) that are synchronized, e.g., to within one unit interval (UI) of each other. Moreover, when both quads 110(1) and 110(2) are configured to select the same re-timing clock (either (i) by both quads selecting rg_clk or (ii) by both quads selecting lc_clk or (iii) by one quad selecting either rg_clk or lc_clk and the other quad selecting ng_clk), those two quads will generate the eight reset signals 156(1)-156(8) to be synchronized, e.g., to within one UI of each other.

In the embodiment of FIG. 1, first sync stage 130 has three parallel sync cells 132 followed by three drivers 134, which are operated like a 3:1 mux, while each sub-stage **150(*i*) in second sync stage 140 has a 3:1 mux 152(*i*) followed by a single sync cell 154(*i*)**. In alternative embodiments, different combinations of these two different types of configurations of sync cells and muxes can be used in the first and second sync stages. In general, the first sync stage can be independently implemented using either (i) parallel sync cells followed by a mux or (ii) a mux followed by a single sync cell, while each sub-stage in the second stage can similarly be independently implemented using either of the same two types of configurations.

Figure 2:
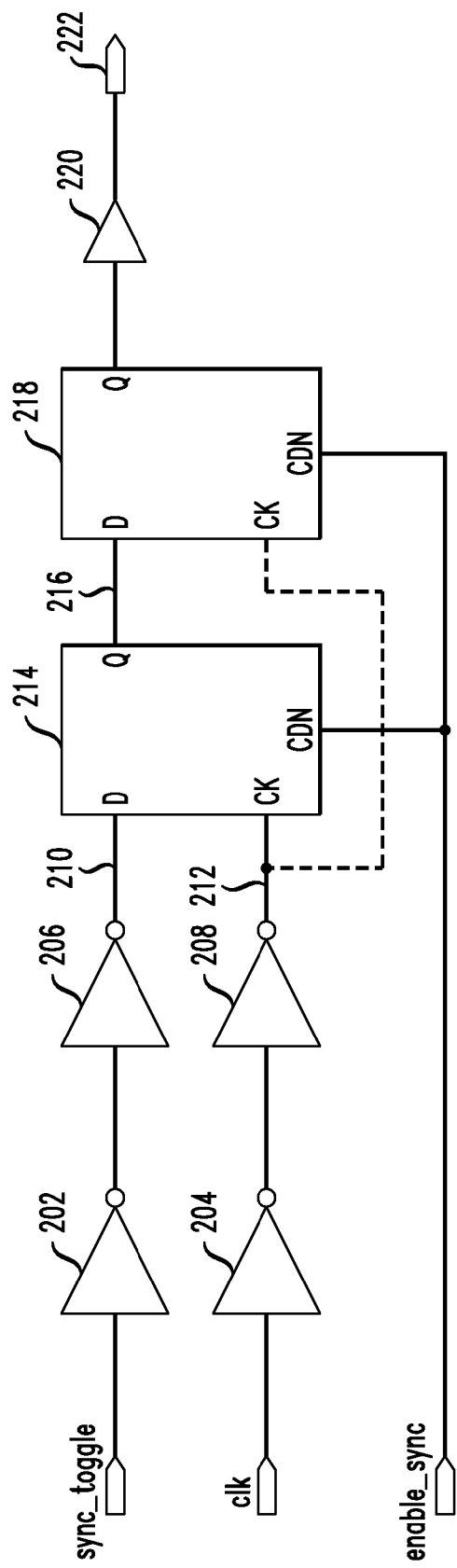
FIG. 2 shows a schematic block diagram of a sync cell that can be used to implement each different sync cell in FIG. 1.

FIG. 2 shows a schematic block diagram of a sync cell 200 that can be used to implement each different sync cell (e.g., 132(1)-132(3), 154(1)-154(4)) in FIG. 1. Sync cell 200 receives a reset signal sync_toggle and a clock signal clk (e.g., lc_clk, rg_clk, or nq_clk) and generates a re-timed reset signal 222 that is synchronized to the clock signal clk. Note that sync cell 200 re-times the received reset signal by synchronizing each rising edge of a pulse in the reset signal to a corresponding rising edge in the received clock signal.

In particular, a first set of buffers (e.g., inverters) 202 and 206 is connected to buffer the received reset signal sync_toggle to generate a buffered reset signal 210. Similarly, a second set of buffers 204 and 208 is connected to buffer the received clock signal clk to generate a buffered clock signal 212. The buffered reset signal 210 and the buffered clock signal 212 are then applied to a first flip-flop 214 to generate a latched reset signal 216. The latched reset signal 216 and the buffered clock signal 212 are then applied to a second flip-flop 218 to generate and output, via driver 220, the re-timed reset signal 222. The control signal enable_sync can be set to 0 or 1 to selectively disable or enable sync cell 200.

Note that FIG. 1 shows a single pair of quads 110(1) and 110(2), where each quad has a multi-channel transmitter that generates four TX signals. In general, integrated circuit 100 may have any number of pairs of quads and/or any number of individual, unpaired quads. Furthermore, integrated circuits of the disclosure may be designed having one or more multi-channel transmitters having numbers of TX channels other than four.

Although each multi-channel transmitter in integrated circuit 100 of FIG. 1 can generate TX signals using any one of three different clock signals, in general, integrated circuits of the disclosure can have any number of different clocks (including just one clock) available for use by its multi-channel transmitters in generating TX signals.

Although each set of sync circuitry in integrated circuit 100 of FIG. 1 has two sync stages, alternative embodiments of the disclosure may have more than two sync stages, with one or more intermediate sync stages located between the first and second sync stages depicted in FIG. 1.

The present invention can be implemented in the context of any suitable type of integrated circuit device, such as, without limitation, application-specific integrated circuits (ASICs), field-programmable gate arrays (FPGAs), programmable logic devices (PLDs), mask-programmable gate arrays (MPGAs), simple programmable logic devices (SPLDs), and complex programmable logic devices (CPLDs).

The present invention may be implemented as (analog, digital, or a hybrid of both analog and digital) circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing blocks in a software program. Such software may be employed in, for example, a digital signal processor, microcontroller, or general-purpose computer.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Signals and corresponding nodes or ports may be referred to by the same name and are interchangeable for purposes here.

It should be appreciated by those of ordinary skill in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. An integrated circuit comprising:
a first multi-channel transmitter having synchronization (sync) circuitry comprising:
a first sync stage configured to synchronize a reset signal to a local clock signal to generate a first-synchronized reset signal; and
a second sync stage configured to synchronize each of a plurality of copies of the first-synchronized reset signal to the local clock signal to generate a plurality of second-synchronized reset signals, where each second-synchronized reset signal is applied to reset a different transmit channel of the first multi-channel transmitter,
wherein the first multi-channel transmitter is configured to select the local clock signal, against which the reset signal is to be synchronized, from any one of a plurality of available clock signals.

2. The invention of claim 1, wherein:
the first sync stage comprises a first-stage sync cell configured to receive the reset signal and the local clock signal and generate the first-synchronized reset signal; and
the second sync stage comprises a different second-stage sync cell for each different transmit channel, each different sync cell configured to receive a corresponding copy of the first-synchronized reset signal and the local clock signal and generate one of the second-synchronized reset signals.

3. The invention of claim 2, wherein the first-stage sync cell comprises:
a first set of one or more buffers connected in series to receive the reset signal and generate a buffered reset signal;
a second set of one or more buffers connected in series to receive the local clock signal and generate a buffered local clock signal;
a first flip-flop connected to receive the buffered reset signal and the buffered local clock signal and generate a latched reset signal; and
a second flip-flop connected to receive the latched reset signal and the buffered local clock signal and generate the first-synchronized reset signal.

4. The invention of claim 2, wherein each second-stage sync cell comprises:
a first set of one or more buffers connected in series to receive the corresponding copy of the first-synchronized reset signal and generate a buffered first-synchronized reset signal;
a second set of one or more buffers connected in series to receive the local clock signal and generate a buffered local clock signal;
a first flip-flop connected to receive the buffered first-synchronized reset signal and the buffered local clock signal and generate a latched first-synchronized reset signal; and
a second flip-flop connected to receive the latched first-synchronized reset signal and the buffered local clock signal and generate the corresponding one of the second-synchronized reset signals.

5. The invention of claim 1, wherein:
the first multi-channel transmitter is configured to generate a first set of transmit signals; and
the integrated circuit further comprises a second multi-channel transmitter configured to generate a second set of transmit signals, wherein the first and second multi-channel transmitters can be configured to use a common clock signal to generate the first and second sets of transmit signals.

6. The invention of claim 5, wherein each multi-channel transmitter can be configured to select any one of a plurality of available clock signals as its local clock signal, wherein one of the available clock signals is a neighbor clock signal corresponding to the clock signal selected by the other multi-channel transmitter as its local clock signal.

7. The invention of claim 1, wherein the integrated circuit comprises:
a first quad having the first multi-channel transmitter configured to generate a first set of four transmit signals; and
a second quad having a second multi-channel transmitter configured to generate a second set of four transmit signals, wherein the first and second quads can be configured to use a common clock signal to generate the first and second sets of transmit signals.

8. The invention of claim 7, wherein each quad can be configured to select any one of a plurality of available clock signals as its local clock signal, wherein one of the available clock signals is a neighboring-quad clock signal corresponding to the clock signal selected by the other quad as its local clock signal.

9. An integrated circuit comprising: a first multi-channel transmitter having synchronization (sync) circuitry comprising:
a first sync stage configured to synchronize a reset signal to a local clock signal to generate a first-synchronized reset signal and
a second sync stage configured to synchronize each of a plurality of copies of the first-synchronized reset signal to the local clock signal to generate a plurality of second-synchronized reset signals, where each second-synchronized reset signal is applied to reset a different transmit channel of the first multi-channel transmitter,
wherein the first multi-channel transmitter is configured to select the local clock signal from any one of a plurality of available clock signals; and
wherein the first sync stage comprises a different first-stage sync cell for each available clock signal, wherein each different first-stage sync cell is configured to receive the reset signal and the corresponding available clock signal and generate a corresponding version of the first-synchronized reset signal.

10. An integrated circuit comprising: a first multi-channel transmitter having synchronization (sync) circuitry comprising:
a first sync stage configured to synchronize a reset signal to a local clock signal to generate a first-synchronized reset signal and
a second sync stage configured to synchronize each of a plurality of copies of the first-synchronized reset signal to the local clock signal to generate a plurality of second-synchronized reset signals, where each second-synchronized reset signal is applied to reset a different transmit channel of the first multi-channel transmitter,
wherein the first multi-channel transmitter is configured to select the local clock signal from any one of a plurality of available clock signals.

11. The invention of claim 1, wherein the integrated circuit is a field-programmable gate array.

12. The invention of claim 10, wherein the second sync stage comprises a different sync sub-stage for each different transmit channel, each different sync sub-stage comprises:
a multiplexer configured to select one of the available clock signals as the local clock signal; and
a sync cell configured to receive a corresponding copy of the first-synchronized reset signal and the local clock signal and generate one of the second-synchronized reset signals.

13. An integrated circuit comprising:
a first multi-channel transmitter having synchronization (sync) circuitry comprising:
a first sync stage configured to synchronize a reset signal to a local clock signal to generate a first-synchronized reset signal;
a second sync stage configured to synchronize each of a plurality of copies of the first-synchronized reset signal to the local clock signal to generate a plurality of second-synchronized reset signals, where each second-synchronized reset signal is applied to reset a different transmit channel of the first multi-channel transmitter, wherein
the first sync stage comprises a first-stage sync cell configured to receive the reset signal and the local clock signal and generate the first-synchronized reset signal,
the second sync stage comprises a different second-stage sync cell for each different transmit channel, each different sync cell configured to receive a corresponding copy of the first-synchronized reset signal and the local clock signal and generate one of the second-synchronized reset signals, and
wherein the first-stage sync cell comprises:
a first set of one or more buffers connected in series to receive the reset signal and generate a buffered reset signal;
a second set of one or more buffers connected in series to receive the local clock signal and generate a buffered local clock signal;
a first flip-flop connected to receive the buffered reset signal and the buffered local clock signal and generate a latched reset signal; and
a second flip-flop connected to receive the latched reset signal and the buffered local clock signal and generate the first-synchronized reset signal.

14. The integrated circuit of claim 13, wherein comprising:
each second-stage sync cell comprises:
a first set of one or more buffers connected in series to receive the corresponding copy of the first-synchronized reset signal and generate a buffered first-synchronized reset signal;
a second set of one or more buffers connected in series to receive the local clock signal and generate a buffered local clock signal;
a first flip-flop connected to receive the buffered first-synchronized reset signal and the buffered local clock signal and generate a latched first-synchronized reset signal; and
a second flip-flop connected to receive the latched first-synchronized reset signal and the buffered local clock signal and generate the corresponding one of the second-synchronized reset signals.

15. An integrated circuit comprising:
a first multi-channel transmitter having synchronization (sync) circuitry comprising:
a first sync stage configured to synchronize a reset signal to a local clock signal to generate a first-synchronized reset signal;
a second sync stage configured to synchronize each of a plurality of copies of the first-synchronized reset signal to the local clock signal to generate a plurality of second-synchronized reset signals, where each second-synchronized reset signal is applied to reset a different transmit channel of the first multi-channel transmitter, wherein:
the first multi-channel transmitter is configured to generate a first set of transmit signals and the integrated circuit further comprises a second multi-channel transmitter configured to generate a second set of transmit signals, the first and second multi-channel transmitters can be configured to use a common clock signal to generate the first and second sets of transmit signals, and each multi-channel transmitter is configured to select any one of a plurality of available clock signals as its local clock signal, wherein one of the available clock signals is a neighbor clock signal corresponding to the clock signal selected by the other multi-channel transmitter as its local clock signal.

* * * * *